Figure 1:
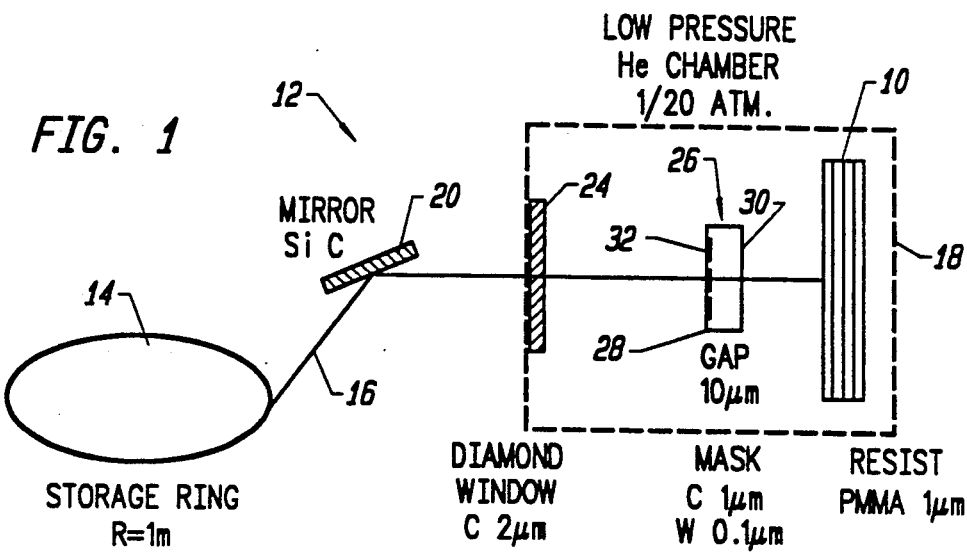

United States Patent [19]
Sethi

[11] Patent Number: 5,314,768
[45] Date of Patent: May 24, 1994

[54] THIN FILM MASK FOR USE IN AN X-RAY LITHOGRAPHIC PROCESS AND ITS METHOD OF MANUFACTURE BY FORMING OPAQUE PATTERN OF IONS IN A DIAMOND LAYER

[75] Inventor: Rakesh B. Sethi, Campbell, Calif.

[73] Assignee: National Semiconductor Corporation, Santa Clara, Calif.

[21] Appl. No.: 34,554

[22] Filed: Mar. 19, 1993

[51] Int. Cl.$^5$ ............................................. G03F 9/00
[52] U.S. Cl. ........................................ 430/5; 427/552; 427/595; 378/34; 378/35; 423/446
[58] Field of Search .......................... 430/5, 311, 320; 423/446; 427/438; 156/603; 378/34, 35

[56] References Cited

U.S. PATENT DOCUMENTS 4,686,162  8/1987  Stangl et al. .......................... 430/5
5,221,411  6/1993  Narayan ............................... 156/603

OTHER PUBLICATIONS

Isotopic effects in a-C:(H/D) films deposited methane/hydrogen RF plasmas, D. Boutard and W. Möller, Materials Research Society, J. Mater, Res., vol. 5, No. 11, Nov. 1990.

Primary Examiner—Steve Rosasco
Attorney, Agent, or Firm—Hickman & Beyer

[57] ABSTRACT

A thin film mask for use in an X-ray lithographic process is disclosed herein along with a method of making the mask which is comprised of a diamond thin film layer supported on one surface of an X-ray transparent non-diamond substrate, for example silicon. A predetermined pattern of ions of a substance opaque to X-rays, for example a heavy atomic number substance such as gold, tungsten or cesium, is introduced into the diamond thin film layer as opposed to being deposited thereon. In one embodiment disclosed herein, this is accomplished by means of ion implantation, and in a second embodiment by means of an ion beam direct write device.

10 Claims, 1 Drawing Sheet

THIN FILM MASK FOR USE IN AN X-RAY LITHOGRAPHIC PROCESS AND ITS METHOD OF MANUFACTURE BY FORMING OPAQUE PATTERN OF IONS IN A DIAMOND LAYER

The present invention relates generally to thin film masks for use in X-ray lithographic processes, and more particularly to a specifically designed mask for use in an X-ray lithographic process and a specific method of manufacturing such a mask.

Optical proximity lithography is well known in the art. Such a process uses a conventional mask, for example a chrome or glass mask, for writing thin line and certain features as small as 0.5 microns onto a cooperating wafer. More recently, there has been a desire to scale down these linewidths and features to, for example, 0.3 microns and less. However, this cannot be accomplished by means of optical lithography but rather requires the use of X-rays. While glass and chrome are not suitable mask materials for such a process, a thin diamond film is since it is transparent to X-rays, rugged and does not alter in structure during the mask making procedure or during the lithographic process.

A particular diamond mask suggested by the prior art for use in an X-ray lithography process is one that comprises a diamond thin film layer supported on one surface of a substrate, for example silicon, and upon which there is deposited a predetermined pattern of a substance opaque to X-rays, for example gold. While such a mask generally functions in the intended manner, the fact that the gold or other such X-ray opaque pattern is deposited on the diamond thin film layer, specifically its front face, has a number of drawbacks. First, the X-ray opaque pattern adds thickness to the diamond thin film layer and therefore increases its aspect ratio which, in turn, decreases its depth of focus. Second, because of this layered configuration between the thin film diamond layer and the layer of X-ray opaque material, optical losses due to diffraction effects occur and the original phase of the light as it passes through the mask is modified.

As will be described in more detail hereinafter, a thin film mask for use in an X-ray lithographic process and design in accordance with the present invention is disclosed herein. This mask is comprised of a diamond thin film layer supported on one face of a non-diamond substrate that is transparent to X-rays, for example a silicon substrate. In accordance with the present invention, a predetermined pattern of ions of a substance opaque to X-rays, for example gold, tungsten or cesium, is introduced into the diamond thin film layer rather than being deposited on its surface as in the prior art. In one embodiment disclosed herein, the ions are introduced into the diamond thin film layer by means of ion implantation and in another embodiment by means of an ion beam direct right device. In either case, the X-ray opaque substance resides within the diamond layer rather than on its surface. As a result, the overall mask's aspect ratio is reduced (as compared to the prior art version) and therefore its depth of focus is increased. Moreover, by eliminating the additional layer to the mask, optical losses within the mask due to diffraction effects are minimized and the X-ray beam is allowed to retain its original phase as it passes through the mask.

Figure 3:
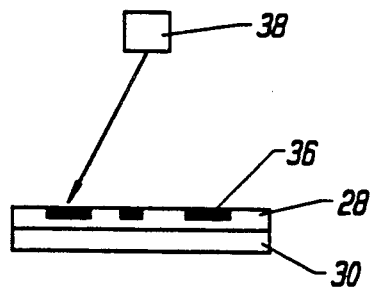
Figures 4A, 4B, 4C:
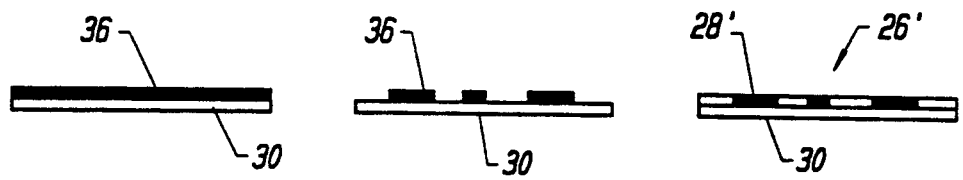

The present invention will be described in more detail hereinafter in conjunction with the drawings, wherein:

FIG. 1 diagrammatically illustrates an assembly for carrying out an X-ray lithographic process on a dielectric substrate, which assembly includes a thin film mask designed and manufactured in accordance with the present invention;

FIGS. 2A–2D diagrammatically illustrate one method of making the thin film mask forming part of the overall assembly illustrated in FIG. 1;

FIG. 3 diagrammatically illustrates a second method of making the same thin film mask; and FIGS. 4A–4C diagrammatically illustrate a modified thin film mask and its method of formation.

Turning now to the drawings, attention is directed to FIG. 1 which, as stated immediately above, diagrammatically illustrates an assembly for carrying out an X-ray lithographic process on a dielectric substrate. The substrate is indicated at 10 and the overall assembly is generally indicated by the reference numeral 12. The assembly is shown including a storage ring or other suitable means 14 for producing a low energy X-ray beam 16 which is directed into a low pressure helium chamber generally indicated at 18 by cooperating means including, for example, SiC mirror 20. The X-ray beam enters chamber 18 through a diamond window 24 and passes through a thin film mask 26 before impinging on the front face of wafer 10. Mask 26 is designed to function in the conventional manner, that is, it passes certain cross-sectional segments of the X-ray beam in accordance with a predetermined pattern such that only that cross-sectional pattern reaches a layer of resist (not shown) deposited on the face of wafer 10, thereby exposing the resist to the extent of the pattern.

Still referring to FIG. 1, attention is specifically directed to mask 26 which is structurally designed and manufactured in accordance with the present invention. As illustrated in FIG. 1, mask 26 includes a diamond thin film layer 28 supported on the front face of a non-diamond substrate 30 that is transparent to X-rays, for example silicon. A predetermined pattern of ions of a substance 32 opaque to X-rays, for example gold, tungsten or cesium, is introduced into the diamond thin film layer rather than being deposited on the surface thereof, as in the prior art. This results in the advantages discussed previously.

Figures 2A, 2B, 2C:
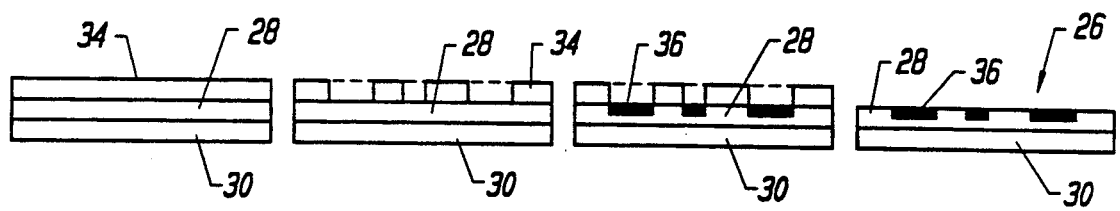

Turning to FIGS. 2A–2D, attention is directed to one method of making thin film mask 26. As a first step, a thin diamond film, for example on the order of 100–1000 Å, is grown-nucleated by conventional means, for example by means of chemical vapor deposition or otherwise, on the silicon substrate 30. Thereafter, a suitable and readily providable layer 34 of resist, for example PMMA, is deposited on the front face of the diamond thin film 28, as depicted in FIG. 2A. The desired pattern is masked onto the resist as seen in FIG. 2B by exposing predetermined segments of the resist using suitable and readily providable means, for example an E beam (not shown). The substrate is then subjected to the implantation of ions of a substance opaque to X-rays, for example gold, tungsten or cesium in the patterned or unmasked areas. That is, the unmasked areas (or the masked areas, depending on the resist used and the exposure technique) are selectively doped with known impurities of gold, tungsten, cesium or other such color center causing metals which can be tailored to specific absorption specifications. This is depicted in FIG. 2C. Following this latter step, the resist 34 is stripped or wet etched from the ion implanted diamond thin film layer, as depicted in FIG. 2D and, if desired, the silicon substrate can be thinned down by any suitable means, for example, by means of a wet etch using a solution of ethylene diamine, pyrocatechol, and water at 115° C. Other HF based chemistries can also be used. In this way, a hard mask which has optically transparent and opaque areas can be made without requiring any material etching (except for removing the resist and thinning the substrate support). At the same time, the advantages discussed previously are achieved.

Turning to FIG. 3, a second method of making the thin film mask 26 is shown. This method differs from the method illustrated in conjunction with FIGS. 2A-2D in that the pattern of X-ray opaque substance is introduced into the diamond thin film layer by means of a readily providable ion beam direct write device generally indicated by the reference numeral 38 rather than by means on ion implantation. As is well known in the art, device 38 is capable of writing into a substrate such as thin film diamond layer 28 ions of gold, tungsten, cesium or other such X-ray opaque material. As a result, no resist layer such as resist layer 34 is required. Device 38 can write the appropriate X-ray opaque pattern directly into the diamond thin film layer as depicted in FIG. 3.

While the thin film mask designed in accordance with the present invention has been described including a diamond thin film layer on a substrate of silicon, it is to be understood that any suitable means for supporting the diamond thin film layer while providing the necessary structural integrity to the overall mask and without interfering with the passage of X-rays therethrough may be utilized. Moreover, the present invention is not limited to the utilization of gold, tungsten or cesium, or other such heavy atomic number substances, but rather any suitable color center causing metal that is compatible with the intended use of the mask.

Overall thin film mask 26 was described previously comprising a non-diamond, X-ray transparent substrate 30 supporting a diamond thin film layer 28 containing within its planar extent a predetermined pattern of ions of a substance 36 opaque to X-rays. This X-ray opaque substance, according to the embodiments illustrated in FIGS. 2 and 3, are introduced into the diamond thin film layer by means of ion implantation or by means of an ion beam direct write device. In accordance with a third embodiment of the present invention, the diamond thin film mask is not formed by first starting with a diamond thin film 28 on substrate 30. Rather, as illustrated in FIG. 4A, the substrate 30 initially supports a layer of the X-ray opaque substance 36, for example the gold, tungsten or cesium, which is deposited or otherwise formed on its top face. Thereafter, using a suitable layer of resist (not shown) and appropriately exposing the resist to form a predetermined pattern, layer 36 is subjected to a conventional etching process in order to form the etched pattern illustrated in FIG. 4B. As a final step, while the unexposed resist (or exposed resist depending on the etching process used) remains in place, the etched pattern is subjected to a diamond chemical vapor deposition or other suitable process in order to fill the spaces within the X-ray opaque substance with layered segment 28' of diamond thin film, as depicted in FIG. 4C. Note specifically that the end result, that is, the diamond thin film mask 26' illustrated in FIG. 4C, is very similar to the diamond thin film mask illustrated in FIG. 2D and FIG. 3. In particular, the diamond thin film and the X-ray opaque substance together form a composite layer within the same plane, as contrasted with the prior art discussed heretofore where the light opaque substance is deposited on top of the diamond thin film layer. Thus, mask 26' incorporates many of the advantages of mask 26, although, mask 26 is preferred because the process of making it is less complicated.

I claim:

1. A thin film mask for use in an X-ray lithographic process, said mask comprising:
   (a) a non-diamond substrate which is transparent to X-rays;
   (b) a diamond thin film layer approximately between 100 and 1,000 Å in thickness, supported by said substrate on one surface thereof; and
   (c) a predetermined pattern of ions of a substance opaque to X-rays introduced into said diamond thin film layer.

2. A thin film mask according to claim 1 wherein said ions are introduced by means of ion implantation.

3. A thin film mask according to claim 1 wherein said ions are introduced by means of an ion beam direct write device.

4. A thin film mask according to claim 1 wherein said substance is selected from the group consisting of gold, tungsten and cesium.

5. A thin film mask according to claim 1 wherein said substrate is silicon.

6. A method of making a thin film mask for use in an X-ray lithographic process, comprising the steps of:
   (a) forming a diamond thin film layer approximately between 100 and 1,000 Å in thickness, on one surface of a non-diamond substrate which is transparent to X-rays; and
   (b) introducing into said diamond thin film layer a predetermined pattern of ions of a substance opaque to X-rays.

7. A method according to claim 6 wherein said ions are introduced into said diamond thin film layer by means of ion implantation.

8. A method according to claim 7 wherein said ions are introduced into said diamond thin film layer by means of an ion beam direct write device.

9. A method according to claim 6 wherein said substance is selected from the group consisting of gold, tungsten and cesium.

10. A method according to claim 5 wherein said substrate is silicon.

* * * * *